(12) United States Patent
Yu et al.

(10) Patent No.: US 12,072,747 B2
(45) Date of Patent: Aug. 27, 2024

(54) POWER OVER CABLE VIA STUB EFFECT MITIGATION METHOD AND SYSTEM FOR CAMERA INTERFACE OF HIGH SPEED PRINTED CIRCUIT BOARD FOR AUTONOMOUS VEHICLES

(71) Applicant: Baidu USA LLC, Sunnyvale, CA (US)

(72) Inventors: Zhenwei Yu, Sunnyvale, CA (US); Yun Ji, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 163 days.

(21) Appl. No.: 17/948,925

(22) Filed: Sep. 20, 2022

(65) Prior Publication Data

US 2024/0094791 A1     Mar. 21, 2024

(51) Int. Cl.
G06F 1/26     (2006.01)
G05D 1/00     (2006.01)

(52) U.S. Cl.
CPC .......... *G06F 1/266* (2013.01); *G05D 1/0246* (2013.01)

(58) Field of Classification Search
CPC ..................................... G06F 1/266
USPC .......................................... 327/565
See application file for complete search history.

(56) References Cited

U.S. PATENT DOCUMENTS

2021/0284098 A1*   9/2021   Scott .................. G01S 13/08

\* cited by examiner

*Primary Examiner* — Tomi Skibinski
(74) *Attorney, Agent, or Firm* — WOMBLE BOND DICKINSON (US) LLP

(57) ABSTRACT

In one embodiment, a printed circuit board (PCB) includes a substrate, one or more signal layers including a first signal layer, a first segment of a transmission line disposed at the first signal layer electrically coupling a first location to a second location, and a first signal via disposed at the second location. The PCB circuit includes a second segment of the transmission line disposed at the first signal layer electrically coupling a third location to a fourth location and a second signal via disposed at the third location. The PCB includes a power-over-cable circuit disposed on a first surface of the substrate and electrically coupled to the first and second signal via, where the first and second segments carry a signal of an image sensor and the first segment carries power from the power-over-cable circuit to the image sensor, where the image sensor is used for an autonomous vehicle.

20 Claims, 13 Drawing Sheets

400

| Application 401 | Planning and Control 402 | Perception 403 | Device Driver(s) 404 | Firmware 405 | Hardware 406 |

FIG. 4

POWER OVER CABLE VIA STUB EFFECT MITIGATION METHOD AND SYSTEM FOR CAMERA INTERFACE OF HIGH SPEED PRINTED CIRCUIT BOARD FOR AUTONOMOUS VEHICLES

TECHNICAL FIELD

Embodiments of the present disclosure relate generally to operating autonomous driving vehicles. More particularly, embodiments of the disclosure relate to power-over-cable (POC) via stub effect mitigation methods and systems for camera interface of high speed printed circuit board (PCB) for autonomous driving vehicles (ADV).

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Autonomous driving vehicles require high speed data signal paths to carry signals of cameras that perceive a surrounding environment of the vehicles. Higher definition cameras require a higher bandwidth utilization for the data signal paths. It is critical to minimize signal reflection and resonance at the signal paths when transmitting the high speed signals.

BRIEF DESCRIPTION OF THE DRAWINGS

Embodiments of the disclosure are illustrated by way of example and not limitation in the figures of the accompanying drawings in which like references indicate similar elements.

FIG. 4 is a block diagram illustrating an example of a decision and planning system according to one embodiment.

DETAILED DESCRIPTION

Figure 1:
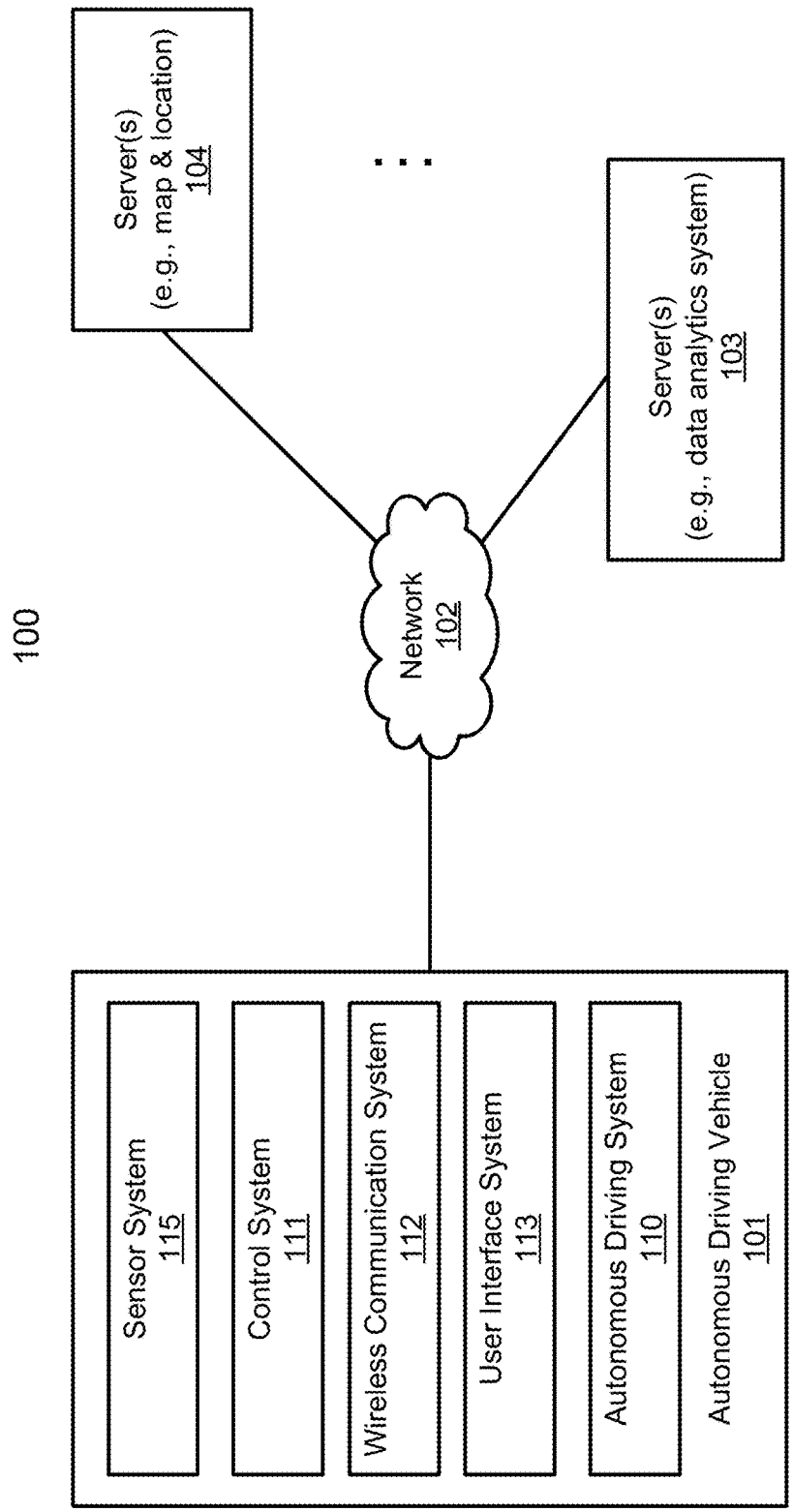
FIG. 1 is a block diagram illustrating a networked system according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, a power over cable (POC) circuit routing method is disclosed to mitigate for stub effect. The routing method uses one or more additional via(s) to minimize the impedance discontinuity at a conductive path at a multi-layer printed circuit board (PCB) that interfaces sensors to receiver chipsets. Having the stub effect mitigated improves data signal quality for a signal transmitted at the conductive path.

Traditionally, sensor manufacturers have supported the Low-Voltage Differential Signaling (LVDS) interface. LVDS interface requires the use of two complementary signals that work as a pair or a channel. Each pair of such signals enables data to be transferred from the image sensor to the FPGA at rates at about 600 Mbit/sec. However, the demand for increased speed means that high speed image sensors require 64 or more LVDS signal pairs.

Standard interfaces such as Ethernet can come with additional latency because of protocol-related overhead and/or throughput limitations for transmission of high speed and large bandwidth sensor data. An interface that does not provide sufficient throughput may further introduce artifacts into the data path.

A power over cable (POC) circuit can minimize the number of wires from a sensor to an interface of a sensor unit. One way to connect a sensor to a POC circuit is by using a signal via that extends from a surface layer to a signal layer, but such a signal via generates a stub effect affecting the quality of the high speed data signal. The stub effect refers a large impedance discontinuity seen by a high frequency incident signal, and consequently, causes signal reflections and resonances leading to signal losses/degradation. The longer the stub, the larger the impedance discontinuity and consequently the larger the impact to the quality of the data signal.

The POC circuit refers to a circuit that supplies power to a sensor by the same transmission medium (e.g., cable wire and transmission line/traces on the printed circuit board) that is used for data signaling. Thus, with a POC circuit, a minimal number of wires are required to be routed to a sensor. In some embodiments, only one signal path is required to connect a sensor to a POC circuit, where the signal path is then routed to a receiver circuit.

According to a first aspect, a method for routing a conductive path within a printed circuit board (PCB) includes routing a first segment of a conductive path from a first location at a first signal layer to a second location at the first signal layer of a printed circuit board (PCB) utilizing a first segment of a transmission line, the PCB having a first surface and a second surface that is opposite the first surface. The method includes routing a second segment of the conductive path from the second location at the first signal layer to a power-over-cable circuit disposed on the first surface of the PCB utilizing a first signal via, the first signal via extending from the first layer to the first surface of the substrate. The method includes routing a third segment of the conductive path from the power-over-cable circuit to a third location at the first signal layer utilizing a second signal via, the second signal via extending from the first layer to the first surface of the substrate. The method includes routing a fourth segment of the conductive path from the third location at the first signal layer to a fourth location at the first signal layer utilizing a second segment of the transmission line, wherein the conductive path is coupled to an image sensor used to perceive an environment of an autonomous driving vehicle (ADV).

In one embodiment, the method further includes routing a fifth segment of the conductive path from the first location to a connector interface utilizing a third signal via, the third signal via extending from the first layer to the first surface of the substrate.

In one embodiment, the connector interface is coupled to a transmission cable to receive a signal from the image sensor.

In one embodiment, the transmission cable is a single wire carrying a serialized signal of the image sensor and carrying power from a power-over-cable circuit to the image sensor.

In one embodiment, the method further includes routing a sixth segment of the conductive path from the fourth location at the first signal layer to a receiver chipset utilizing a fourth signal via, the fourth signal via extending from the first layer to the first surface of the substrate and the receiver chipset receives a signal for processing.

In one embodiment, the transmission line is a microstrip. In one embodiment, a power transmitted from the power-over-cable circuit to the image sensor is direct current (DC) wherein the signal transmitted from the image sensor to the receiver chipset is a signal with a frequency greater than a gigabits per second.

According to a second aspect, a printed circuit board (PCB) of an autonomous driving vehicle includes a substrate and one or more signal layers in between a first surface and a second surface of the substrate, the one or more signal layers including a first signal layer. The PCB includes a first segment of a transmission line disposed at the first signal layer electrically coupling a first location to a second location of the first signal layer and a first signal via disposed at the second location extending from the first layer to the first surface of the substrate. The PCB includes a second segment of the transmission line disposed at the first signal layer electrically coupling a third location to a fourth location of the first signal layer and a second signal via disposed at the third location of the first signal layer extending from the first layer to the first surface of the substrate. The PCB includes a power-over-cable circuit disposed on the first surface of the substrate and electrically coupled to the first and second signal via, wherein the first and second segments of the transmission line carry a signal of an image sensor from the first location to the fourth location and the first segment of the transmission line carries power from the power-over-cable circuit to the image sensor, where the image sensor is used to perceive an environment of an autonomous driving vehicle (ADV). Having a signal (data) transmitted through the second via to the POC circuit and from the POC circuit to the second signal via mitigates the stub effect.

In one embodiment, the PCB further includes a third signal via disposed at the first location extending from the first layer to the first surface of the substrate, the third signal via electrically coupling a connector interface to the first segment of transmission line at the first location.

In one embodiment, the PCB further includes a connector interface disposed on the first surface and electrically coupled to a third signal via, wherein a transmission cable that is electrically coupled to the image sensor is extended to electrically couple the image sensor to the connector interface.

In one embodiment, the transmission cable is a single wire carrying a serialized signal of the image sensor and carrying power from a power-over-cable circuit of the PCB to the image sensor.

In one embodiment, the PCB further includes a fourth signal via disposed at the fourth location extending from the first layer to the first surface of the substrate and the fourth signal via is electrically coupled to a receiver chipset to transmit the signal of the image sensor to the receiver chipset.

In one embodiment, the transmission line is a microstrip. In one embodiment, the power transmitted from the power-over-cable circuit to the image sensor is direct current (DC) wherein the signal transmitted from the image sensor to the receiver chipset is a signal with a frequency greater than a gigabits per second.

According to a third aspect, a sensor system of an autonomous driving vehicle includes an image sensor, a printed circuit board (PCB), and a transmission cable electrically coupling the image sensor to the PCB. The PCB includes a substrate and one or more signal layers in between a first surface and a second surface of the substrate including at least a first signal layer. The PCB includes a first segment of a transmission line disposed at the first signal layer electrically coupling a first location and a second location of the first signal layer and a first signal via disposed at the second location extending from the first layer to the first surface of the substrate. The PCB includes a second segment of the transmission line disposed at the first signal layer electrically coupling a third location and a fourth location of the first signal layer and a second signal via disposed at the third location of the first signal layer extending from the first layer to the first surface of the substrate. The PCB includes a power-over-cable circuit disposed on the first surface of the substrate and electrically coupled to the first and second signal via, wherein the first and second segments of the transmission line carry the signal of the image sensor from the first location to the fourth location and the first segment of the transmission line carries power from the power-over-cable circuit to the image sensor, where the image sensor is used to perceive an environment of an autonomous driving vehicle (ADV). Having a signal (data) transmitted through the second via to the POC circuit and from the POC circuit to the second signal via mitigates the stub effect.

FIG. 1 is a block diagram illustrating an autonomous driving network configuration according to one embodiment of the disclosure. Referring to FIG. 1, network configuration 100 includes autonomous driving vehicle (ADV) 101 that may be communicatively coupled to one or more servers 103-104 over a network 102. Although there is one ADV shown, multiple ADVs can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, or location servers, etc.

An ADV refers to a vehicle that can be configured to in an autonomous mode in which the vehicle navigates through an environment with little or no input from a driver. Such an ADV can include a sensor system having one or more sensors that are configured to detect information about the environment in which the vehicle operates. The vehicle and its associated controller(s) use the detected information to navigate through the environment. ADV 101 can operate in a manual mode, a full autonomous mode, or a partial autonomous mode.

In one embodiment, ADV 101 includes, but is not limited to, autonomous driving system (ADS) 110, vehicle control system 111, wireless communication system 112, user interface system 113, and sensor system 115. ADV 101 may further include certain common components included in ordinary vehicles, such as, an engine, wheels, steering wheel, transmission, etc., which may be controlled by vehicle control system 111 and/or ADS 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
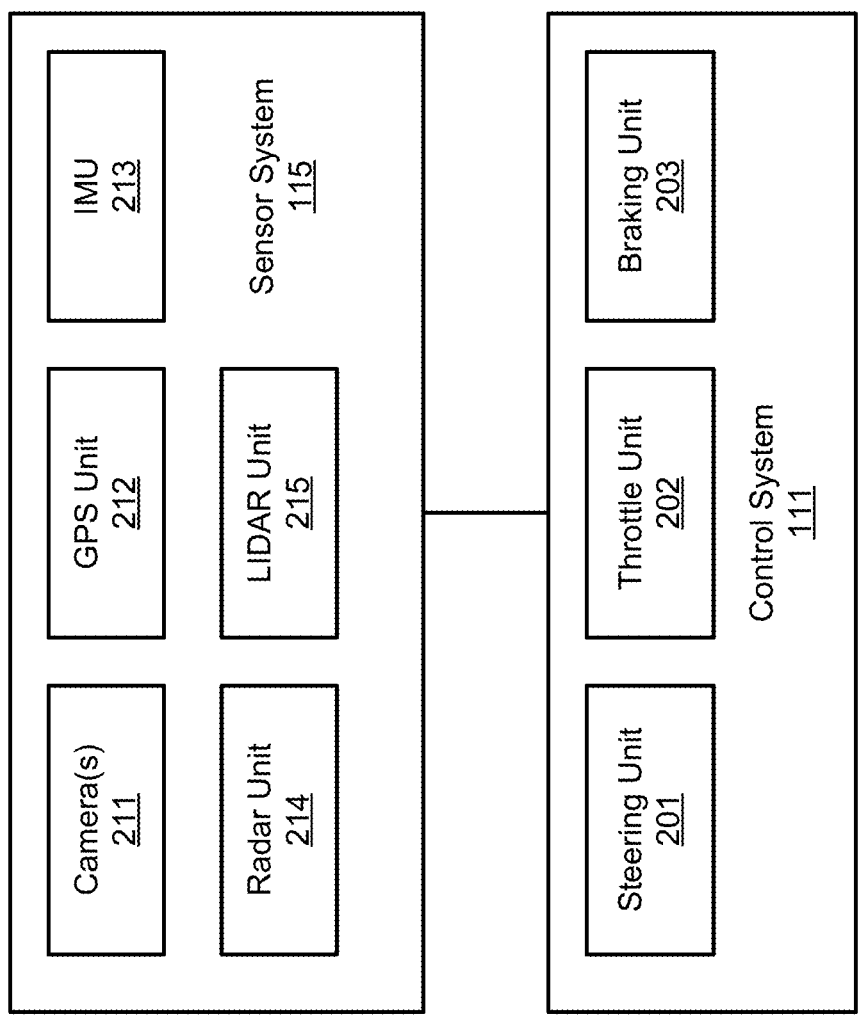
FIG. 2 is a block diagram illustrating an example of an autonomous driving vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the ADV. IMU unit 213 may sense position and orientation changes of the ADV based on inertial acceleration. Radar unit 214 may represent a system that utilizes radio signals to sense objects within the local environment of the ADV. In some embodiments, in addition to sensing objects, radar unit 214 may additionally sense the speed and/or heading of the objects. LIDAR unit 215 may sense objects in the environment in which the ADV is located using lasers. LIDAR unit 215 could include one or more laser sources, a laser scanner, and one or more detectors, among other system components. Cameras 211 may include one or more devices to capture images of the environment surrounding the ADV. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the ADV. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn controls the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is to allow communication between ADV 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of ADV 101 may be controlled or managed by ADS 110, especially when operating in an autonomous driving mode. ADS 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, ADS 110 may be integrated with vehicle control system 111.

For example, a user as a passenger may specify a starting location and a destination of a trip, for example, via a user interface. ADS 110 obtains the trip related data. For example, ADS 110 may obtain location and route data from an MPOI server, which may be a part of servers 103-104. The location server provides location services and the MPOI server provides map services and the POIs of certain locations. Alternatively, such location and MPOI information may be cached locally in a persistent storage device of ADS 110.

While ADV 101 is moving along the route, ADS 110 may also obtain real-time traffic information from a traffic information system or server (TIS). Note that servers 103-104 may be operated by a third party entity. Alternatively, the functionalities of servers 103-104 may be integrated with ADS 110. Based on the real-time traffic information, MPOI information, and location information, as well as real-time local environment data detected or sensed by sensor system 115 (e.g., obstacles, objects, nearby vehicles), ADS 110 can plan an optimal route and drive vehicle 101, for example, via control system 111, according to the planned route to reach the specified destination safely and efficiently.

Figure 3A:
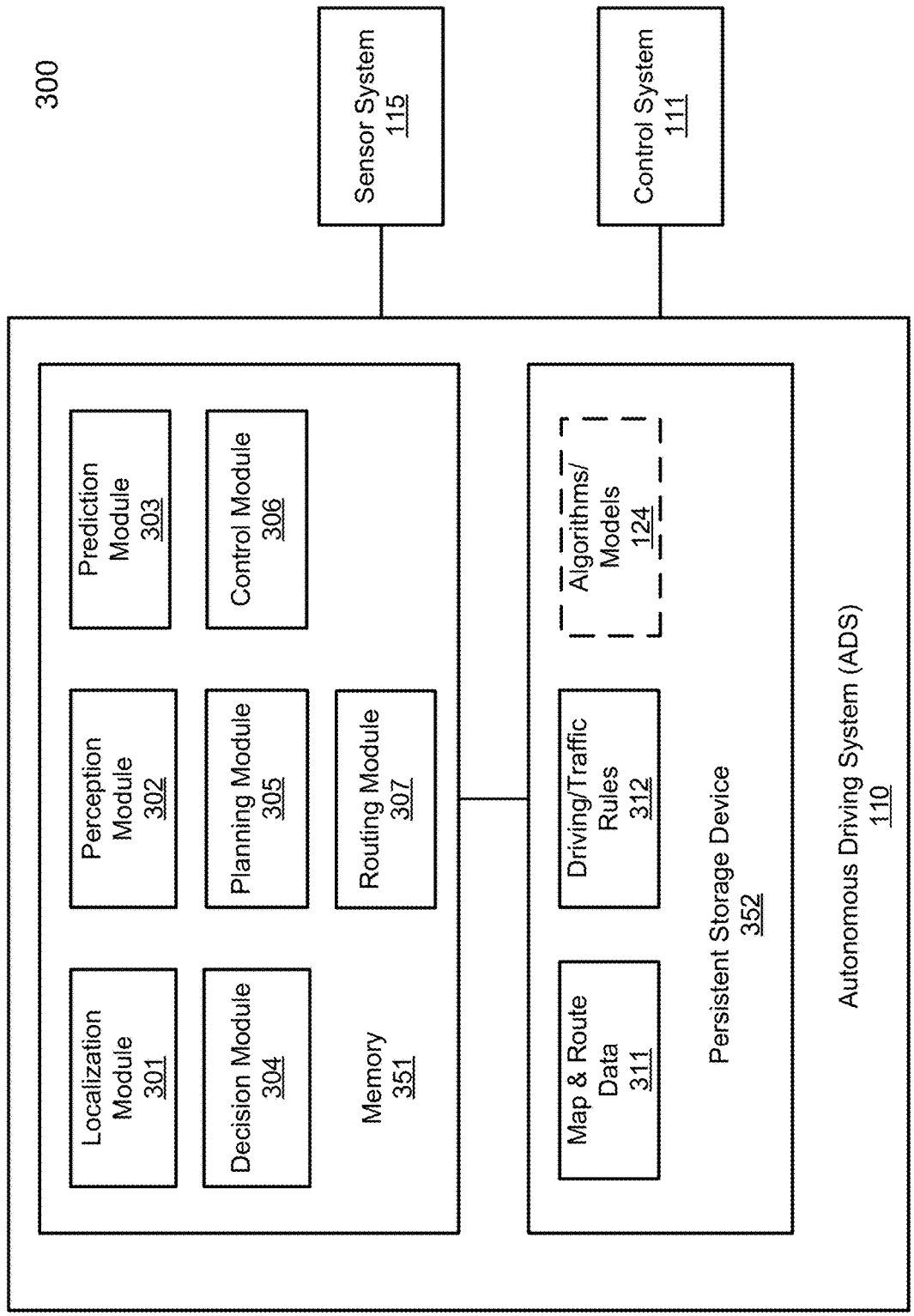
FIGS. 3A-3B are block diagrams illustrating an example of an autonomous driving system used with an autonomous driving vehicle according to one embodiment.
Figure 3B:
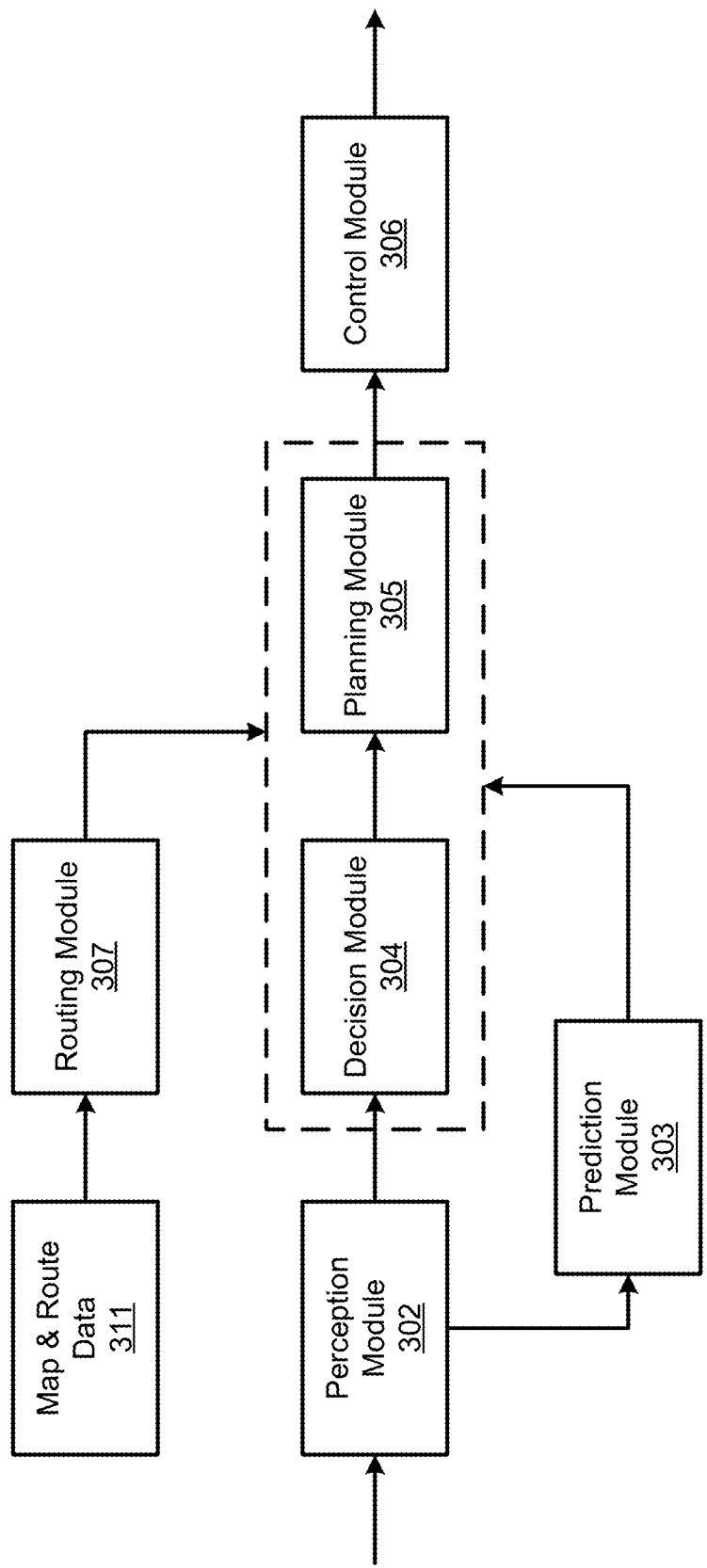

FIGS. 3A and 3B are block diagrams illustrating an example of an autonomous driving system used with an ADV according to one embodiment. System 300 may be implemented as a part of ADV 101 of FIG. 1 including, but is not limited to, ADS 110, control system 111, and sensor system 115. Referring to FIGS. 3A-3B, ADS 110 includes, but is not limited to, localization module 301, perception module 302, prediction module 303, decision module 304, planning module 305, control module 306, and routing module 307.

Some or all of modules 301-307 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-307 may be integrated together as an integrated module.

Localization module 301 determines a current location of ADV 101 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of ADV 101, such as map and route data 311, to obtain the trip related data. For example, localization module 301 may obtain location and route data from a location server and a map and POI (MPOI) server. A location server provides location services and an MPOI server provides map services and the POIs of certain locations, which may be cached as part of map and route data 311. While ADV 101 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras in order to identify objects and/or features in the environment of the ADV. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR.

For each of the objects, prediction module 303 predicts what the object will behave under the circumstances. The prediction is performed based on the perception data perceiving the driving environment at the point in time in view of a set of map/route information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to enter the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Based on a decision for each of the objects perceived, planning module 305 plans a path or route for the ADV, as well as driving parameters (e.g., distance, speed, and/or turning angle), using a reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 101 would move in a next moving cycle (e.g., next route/path segment). For example, the planning and control data may instruct vehicle 101 to move 10 meters at a speed of 30 miles per hour (mph), then change to a right lane at the speed of 25 mph.

Based on the planning and control data, control module 306 controls and drives the ADV, by sending proper commands or signals to vehicle control system 111, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the ADV. For example, the navigation system may determine a series of speeds and directional headings to affect movement of the ADV along a path that substantially avoids perceived obstacles while generally advancing the ADV along a roadway-based path leading to an ultimate destination. The destination may be set according to user inputs via user interface system 113. The navigation system may update the driving path dynamically while the ADV is in operation. The navigation system can incorporate data from a GPS system and one or more maps so as to determine the driving path for the ADV.

FIG. 4 is a block diagram illustrating system architecture for autonomous driving according to one embodiment. System architecture 400 may represent system architecture of an autonomous driving system as shown in FIGS. 3A and 3B. Referring to FIG. 4, system architecture 400 includes, but it is not limited to, application layer 401, planning and control (PNC) layer 402, perception layer 403, driver layer 404, firmware layer 405, and hardware layer 406. Application layer 401 may include user interface or configuration application that interacts with users or passengers of an autonomous driving vehicle, such as, for example, functionalities associated with user interface system 113. PNC layer 402 may include functionalities of at least planning module 305 and control module 306. Perception layer 403 may include functionalities of at least perception module 302. In one embodiment, there is an additional layer including the functionalities of prediction module 303 and/or decision module 304. Alternatively, such functionalities may be included in PNC layer 402 and/or perception layer 403. System architecture 400 further includes driver layer 404, firmware layer 405, and hardware layer 406. Firmware layer 405 may represent at least the functionality of sensor system 115, which may be implemented in a form of a field programmable gate array (FPGA). Hardware layer 406 may represent the hardware of the autonomous driving vehicle such as control system 111. Layers 401-403 can communicate with firmware layer 405 and hardware layer 406 via device driver layer 404.

Figure 5A:
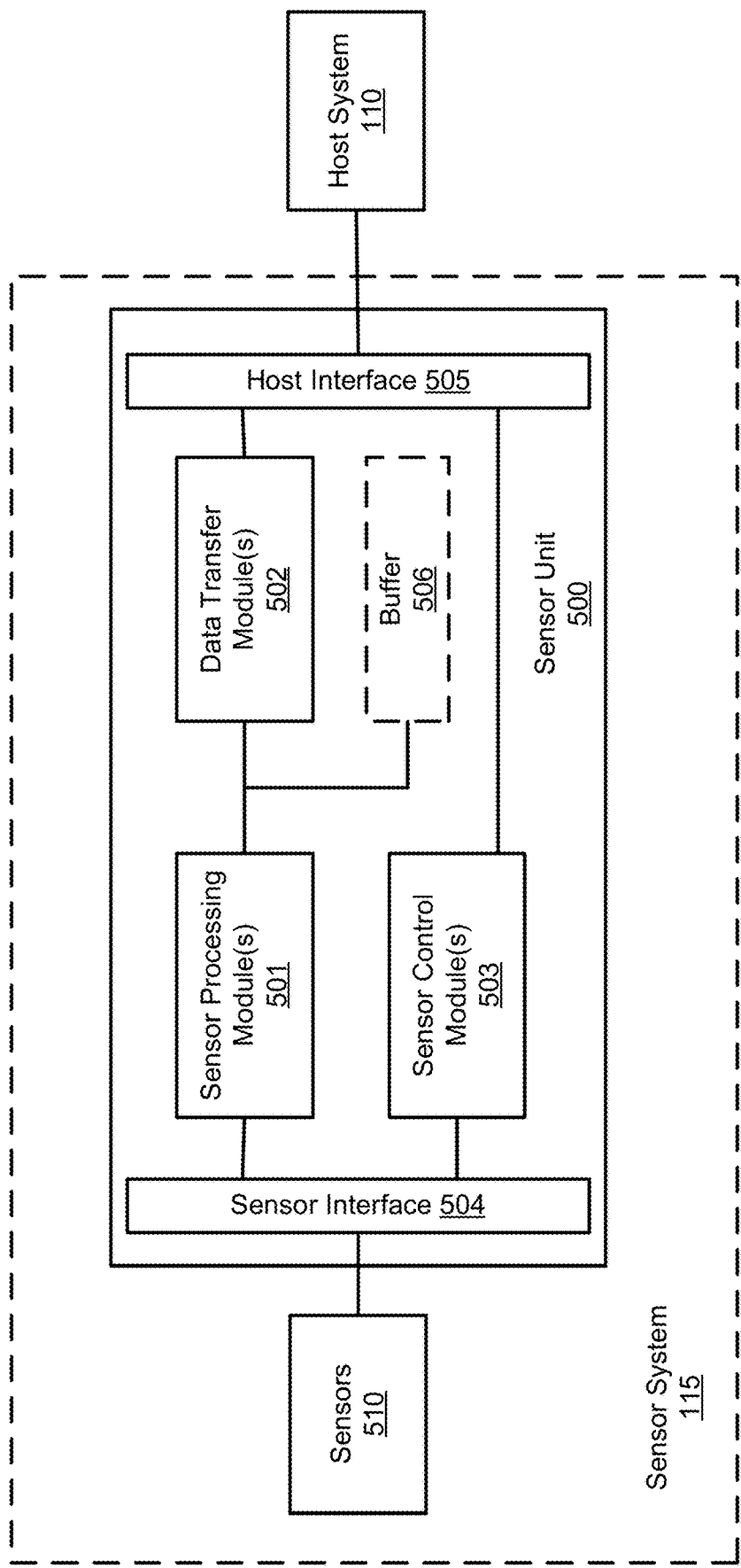
FIG. 5A is a block diagram illustrating an example of a sensor system according to one embodiment.

FIG. 5A is a block diagram illustrating an example of a sensor system according to one embodiment of the invention. Referring to FIG. 5A, sensor system 115 includes a number of sensors 510 and a sensor unit 500 coupled to host system 110. Host system 110 represents a planning and control system as described above, which may include at least some of the modules as shown in FIGS. 3A and 3B. Sensor unit 500 may be implemented in a form of an FPGA device or an ASIC (application specific integrated circuit) device. In one embodiment, sensor unit 500 includes, amongst others, one or more sensor data processing modules 501 (also simply referred to as sensor processing modules), data transfer modules 502, and sensor control modules or logic 503. Modules 501-503 can communicate with sensors 510 via a sensor interface 504 and communicate with host system 110 via host interface 505. Optionally, an internal or external buffer 506 may be utilized for buffering the data for processing.

In one embodiment, for the receiving path or upstream direction, sensor processing module 501 is configured to receive sensor data from a sensor via sensor interface 504 and process the sensor data (e.g., format conversion, error checking), which may be temporarily stored in buffer 506. Data transfer module 502 is configured to transfer the processed data to host system 110 using a communication protocol compatible with host interface 505. Similarly, for the transmitting path or downstream direction, data transfer module 502 is configured to receive data or commands from host system 110. The data is then processed by sensor processing module 501 to a format that is compatible with the corresponding sensor. The processed data is then transmitted to the sensor.

In one embodiment, sensor control module or logic 503 is configured to control certain operations of sensors 510, such as, for example, timing of activation of capturing sensor data, in response to commands received from host system (e.g., perception module 302) via host interface 505. Host system 110 can configure sensors 510 to capture sensor data in a collaborative and/or synchronized manner, such that the sensor data can be utilized to perceive a driving environment surrounding the vehicle at any point in time.

Sensor interface 504 can include one or more of Ethernet, USB (universal serial bus), LTE (long term evolution) or cellular, WiFi, GPS, camera, CAN, serial (e.g., universal asynchronous receiver transmitter or UART), SIM (subscriber identification module) card, and other general purpose input/output (GPIO) interfaces. Host interface 505 may be any high speed or high bandwidth interface such as PCIe (peripheral component interconnect or PCI express) interface. Sensors 510 can include a variety of sensors that are utilized in an autonomous driving vehicle, such as, for example, a camera, a LIDAR device, a RADAR device, a GPS receiver, an IMU, an ultrasonic sensor, a GNSS (global navigation satellite system) receiver, an LTE or cellular SIM card, vehicle sensors (e.g., throttle, brake, steering sensors), and system sensors (e.g., temperature, humidity, pressure sensors), etc.

For example, a camera can be coupled via an Ethernet or a GPIO interface. A GPS sensor can be coupled via a USB or a specific GPS interface. Vehicle sensors can be coupled via a CAN interface. A RADAR sensor or an ultrasonic sensor can be coupled via a GPIO interface. A LIDAR device can be coupled via an Ethernet interface. An external SIM module can be coupled via an LTE interface. Similarly, an internal SIM module can be inserted onto a SIM socket of sensor unit 500. The serial interface such as UART can be coupled with a console system for debug purposes.

Note that sensors 510 can be any kind of sensors and provided by various vendors or suppliers. Sensor processing module 501 is configured to handle different types of sensors and their respective data formats and communication protocols. According to one embodiment, each of sensors 510 is associated with a specific channel for processing sensor data and transferring the processed sensor data between host system 110 and the corresponding sensor. Each channel includes a specific sensor processing module and a specific data transfer module that have been configured or programmed to handle the corresponding sensor data and protocol, as shown in FIG. 5B.

Figure 5B:
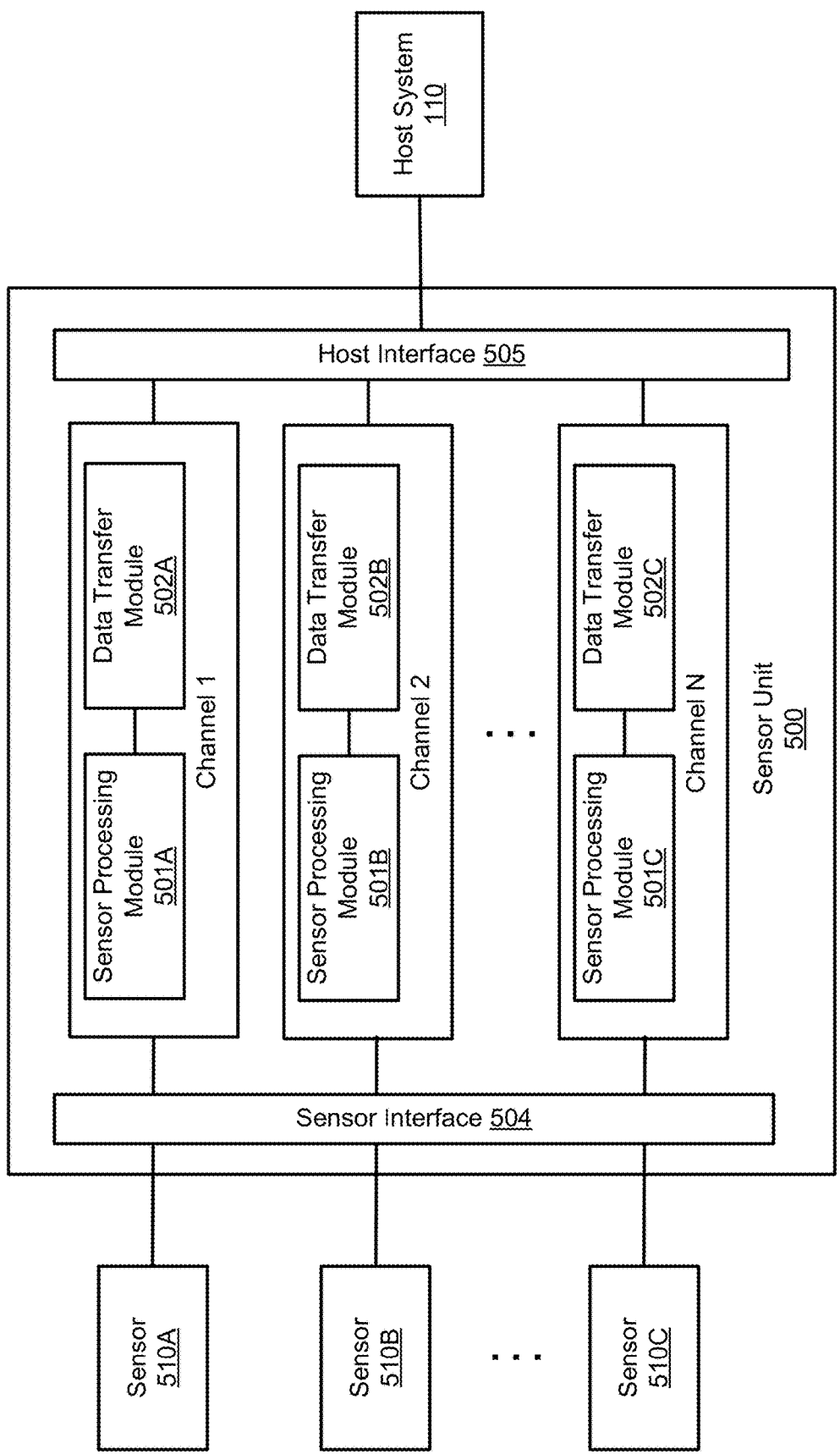
FIG. 5B is a block diagram illustrating the sensor system of FIG. 5A having multiple communication channels according to one embodiment.

Referring now to FIG. 5B, sensor processing modules 501A-501C are specifically configured to process sensor data obtained from sensors 510A-510C respectively. Note that sensors 510A-510C may the same or different types of sensors. Sensor processing modules 501A-501C can be configured (e.g., software configurable) to handle different sensor processes for different types of sensors. For example, if sensor 510A is a camera, processing module 501A can be figured to handle pixel processing operations on the specific pixel data representing an image captured by camera 510A. Similarly, if sensor 510A is a LIDAR device, processing module 501A is configured to process LIDAR data specifically. That is, according to one embodiment, dependent upon the specific type of a particular sensor, its corresponding processing module can be configured to process the corresponding sensor data using a specific process or method corresponding to the type of sensor data.

Similarly, data transfer modules 502A-502C can be configured to operate in different modes, as different kinds of sensor data may be in different size or sensitivities that require different speed or timing requirement. According to one embodiment, each of data transfer modules 502A-502C can be configured to operate in one of a low latency mode, a high bandwidth mode, and a memory mode (also referred to as a fixed memory mode).

When operating in a low latency mode, according to one embodiment, a data transfer module (e.g., data transfer module 502) is configured to send the sensor data received from a sensor to the host system as soon as possible without or with minimum delay. Some of sensor data are very sensitive in terms of timing that need to be processed as soon as possible. Examples of such sensor data include vehicle status such as vehicle speed, acceleration, steering angle, etc.

When operating in a high bandwidth mode, according to one embodiment, a data transfer module (e.g., data transfer module 502) is configured to accumulate the sensor data received from a sensor up to a predetermined amount, but is still within the bandwidth the connection between the data transfer module and the host system 110. The accumulated sensor data is then transferred to the host system 110 in a batch that maximum the bandwidth of the connection between the data transfer module and host system 110. Typically, the high bandwidth mode is utilized for a sensor that produces a large amount of sensor data. Examples of such sensor data include camera pixel data.

When operating in a memory mode, according to one embodiment, a data transfer module is configured to write the sensor data received from a sensor directly to a memory location of a mapped memory of host system 110, similar to a shared memory page. Examples of the sensor data to be transferred using memory mode include system status data such as temperature, fans speed, etc.

Figure 6:
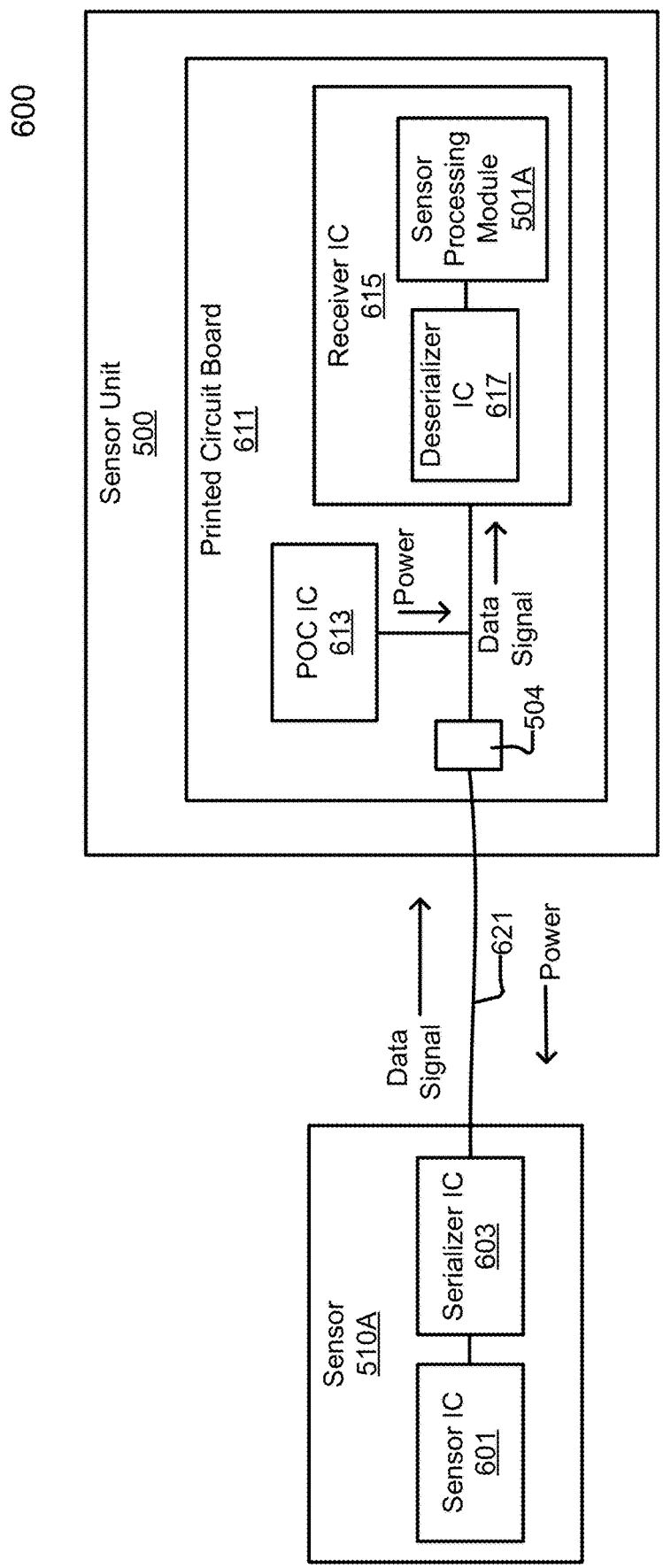
FIG. 6 is a block diagram illustrating a sensor module coupled to a sensor interface of a sensor system according to one embodiment.

FIG. 6 is a block diagram illustrating power over cable between a sensor module and a sensor interface of a sensor system according to one embodiment. Block diagram 600 can represent the connections for sensor interface 504 for channel 1 of FIG. 5B. Referring to FIG. 6, sensor 510A can include a sensor integrated circuit (IC) 601 and a serializer IC 603. The sensor IC can include an array of image photodiodes (e.g., charge coupled device (CCD) or CMOS solid state image sensors, etc.) to capture light incident at sensor 510A. In some embodiments, sensor IC 601 includes a LIDAR sensor, a RADAR sensor, or a time of flight (TOF) sensor IC. In one embodiment, sensor data are generated as parallel data arrays representing multiple pixel lines/color channels. Serializer IC 603 can receive the parallel data arrays and convert the data arrays to a serial data stream according to a particular SerDes protocol. Some example ser/des chipsets that can serialize and deserialize data arrays can include the V3Link™ SerDes IC by Texas Instrument™, and gigabit multimedia serial link (GMSL™) SerDes IC by Maxim Integrated™, etc.

In one embodiment, sensor unit 500 includes a PCB 611 to interface with sensor 510A. In one embodiment, PCB 611 includes sensor interface 504, POC IC 613, and receiver IC 615. Receiver IC 615 can include deserializer IC 617 which corresponds to serializer IC 603, and sensor processing module 501A. Sensor interface 504, POC IC 613, and receiver IC 615 can be disposed on a surface of PCB 611.

Sensor interface 504 can be a general purpose input/output (GPIO) interface. In one embodiment, sensor interface 504 includes a female pin socket/male pin and sensor interface 504 can connect to a male pin/female pin socket from cable wire 621 to receive a signal from sensor 510A. The signal can be routed through a conductive path of PCB 611 from sensor interface 504 to receiver IC 615, as further described in FIGS. 7-10.

Receiver IC 615 can include a deserializer IC 617 that converts the serial signal back to the parallel data arrays. Sensor processing module 501A can receive the parallel data for processing. In one embodiment, sensor 510A receives power from POC IC 613 through the same conductive path. Thus, both a supply power and sensor data signal can be carried on a same cable wire 621 and conductive path.

Figure 7:
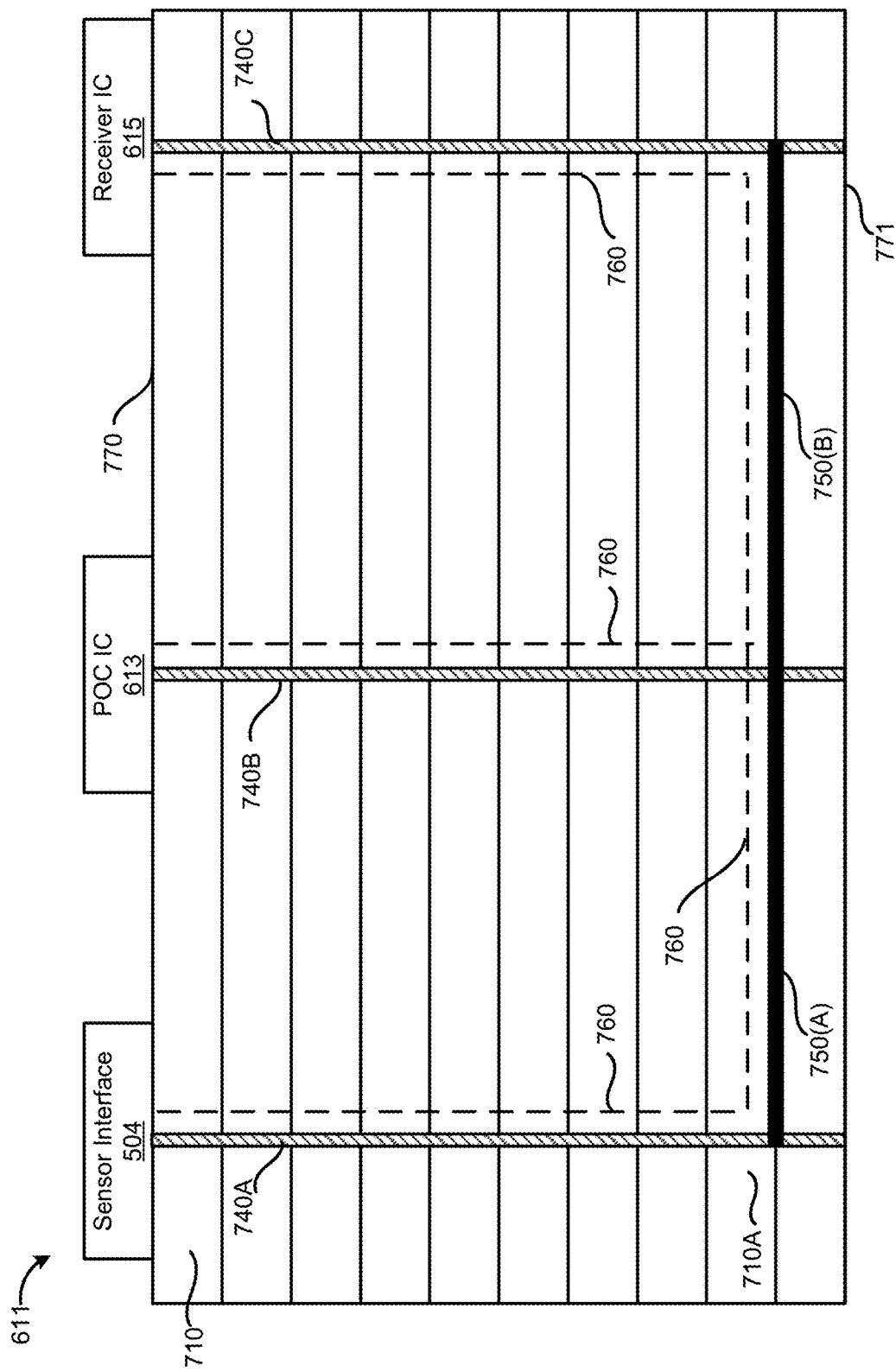
FIG. 7 is a block diagram illustrating routes of a conductive path at a printed circuit board (PCB) of a sensor system.
Figure 8:
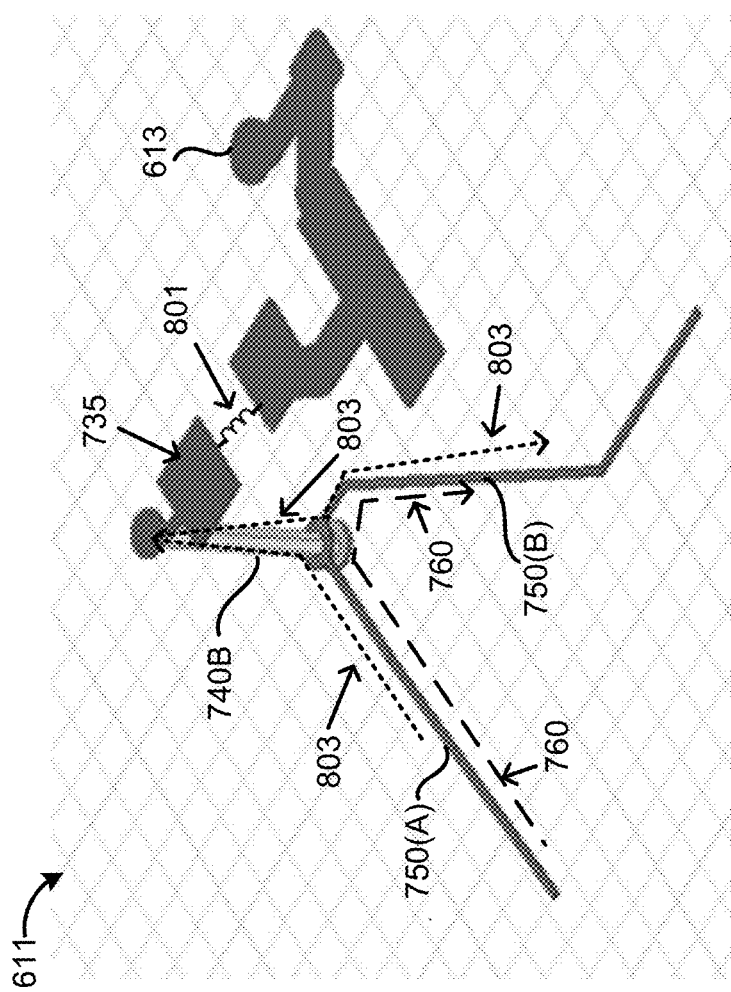
FIG. 8 is a block diagram illustrating a portion of a conductive path of FIG. 7.

FIG. 7 is a schematic block diagram for a printed circuit board (PCB) 611 illustrating the challenges of stub effects with high frequency signals within PCB 611. FIG. 8 is a perspective view of PCB 611. FIGS. 7-8 may illustrate challenges with the PCB 611 as recognized by the inventors. FIGS. 7-8, as well as the other figures, may use like reference numerals to identify like elements. Thus, the same or similar numbers may be described with reference to other drawings even if they are neither mentioned nor described in the corresponding drawing. Also, elements that are not denoted by reference numbers may be described with reference to other drawings. A letter after a reference numeral, such as "710A," indicates that the text refers specifically to the element having that particular reference numeral. A reference numeral in the text without a following letter, such as "710," refers to any or all of the elements in the figures bearing that reference numeral.

Referring to FIG. 7, a PCB 611 may include one or more layers 710. In some embodiments, layer 710 may include an insulating material (e.g., substrate or substrate layer) covered and/or implanted with a conductive material, such as copper (e.g., signal layer). The conductive material of the layers 710 of the PCB 611 may be etched or otherwise processed to form a conductive path 760 (e.g., signal layer). Conductive path 760 may extend along and/or in between layers 710.

In some embodiments, conductive path 760 may extend between layers 710 utilizing via 740. In FIG. 7, via 740A-740C are illustrated, though other configurations of via 740 will be understood by those of ordinary skill in the art. Via 740 can be formed by creating holes in layers 710 of PCB 611. In some embodiments, the holes may be formed by drilling. Though FIG. 7 illustrates the via 740 penetrating the entire PCB 611, the embodiments of the present disclosure are not limited to such a configuration. The holes in PCB 611 may be made conductive, such as by electroplating with copper or other conductive materials, so as to form conductive via 740. In some embodiments, the holes may be made conductive prior to the layers 710 of PCB 611 are being laminated together.

Conductive via 740 may be utilized to connect different layers 710 of the PCB 611 to one another and/or to a surface 770 of PCB 611. For example, a conductive path 760 may be routed from a sensor interface 504 to via 740A and then routed from via 740A to trace and/or transmission line 750. Transmission line 750 can include segments 750A-750B, where segment 750A routes from via 740A to via 740B and segment 750B routes from via 740B to via 740C. Via 740B can be coupled to POC IC 613 and via 740C can be coupled to receiver IC 615 on surface 770. In some embodiments, although not shown, conductive path 760 can be routed to other electronic components (e.g., capacitor, resistor, inductor, other IC, or the like), or circuit components. Circuit components may be mounted to surface 770 of PCB 611 and electrically connected to conductive path 760.

FIG. 8 illustrates a perspective view of a portion of conductive path 760 of FIG. 7, with layers 710 of FIG. 7 removed for ease of illustration. Referring to FIG. 8, it can be seen that via 740B are implemented as structures that extend substantially perpendicular to conductive traces/wires 750 (e.g., 750A and 750B) as part of conductive path 760. Conductive path 760 can be electrically connected to via 740B (e.g., POC IC 613) to receive a supply of power (e.g., direct current (DC)) to be carried to a sensor.

For example, conductive path 760 extends onto a surface of the PCB 611 by a connection to via 740B at or near a surface of PCB 611. Conductive path 760 may then extend on the surface of the PCB 611 to a mounting pad 735. The mounting pad 735 may be provided to allow for a mounting surface for POC IC 613. POC IC 613 may be mounted to mounting pad 735.

Though not expressly illustrated in FIG. 8, conductive path 760 may further extend from mounting pad 735 to other electronic components or to connect to other portions of PCB 611 to implement complex circuits of an electronic device. However, as illustrated in FIGS. 7-8, the structure of via 740B utilized in PCB 611 may cause a via stub effect when the data transmission signals are at a high frequency (e.g., greater than a gigabit per second). The via stub effect is where a via stub acts like a resonant circuit with a specific resonant frequency. If the signal has a significant component at or near that frequency, that component of the signal will be heavily attenuated due to the energy demands of the via stub at its resonant frequency. For example, the configuration of conductive path 760 and via 740B may result in via 740B seen as an open circuit by high frequency signals. High frequency incident signals can view the via 740B/mounting pad 735 as an inductor 801 (e.g., open circuit) at high frequency and the high frequency incident signals (e.g., sensor data signal) would follow either path 760 or path 803. For path 803, incident signal enters then reflects from via 740B due to the long stub effect at via 740B. The reflected signal and the incident signal are additive at trace segment 750B. Thus, at trace 750B, the reflected signal may destructively interference with the incident signal to cause resonance, deterioration, and/or artifacts in the data signal.

Figure 9:
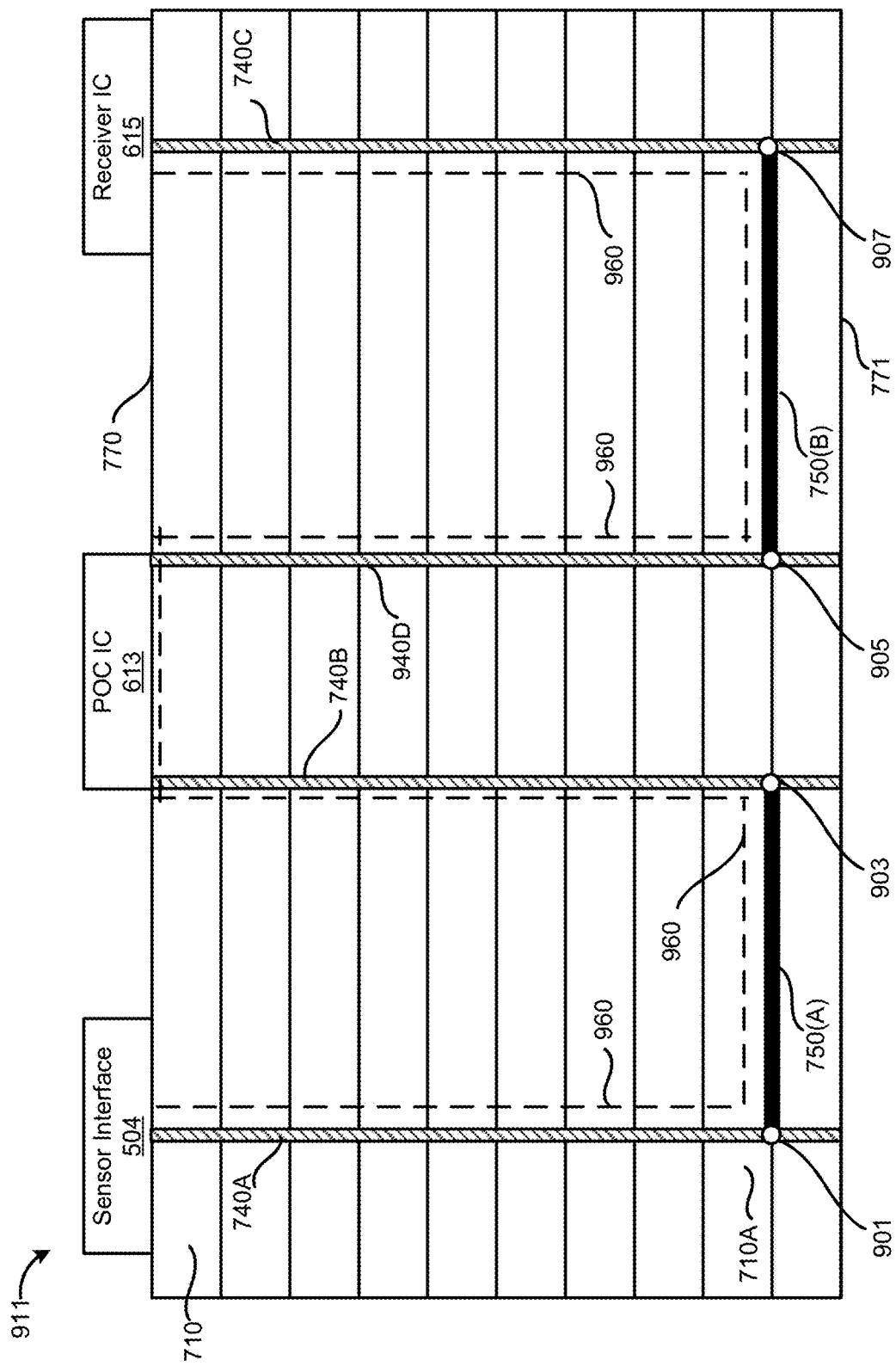
FIG. 9 is a block diagram illustrating routes of a conductive path at a printed circuit board (PCB) of a sensor system according to one embodiment.
Figure 10:
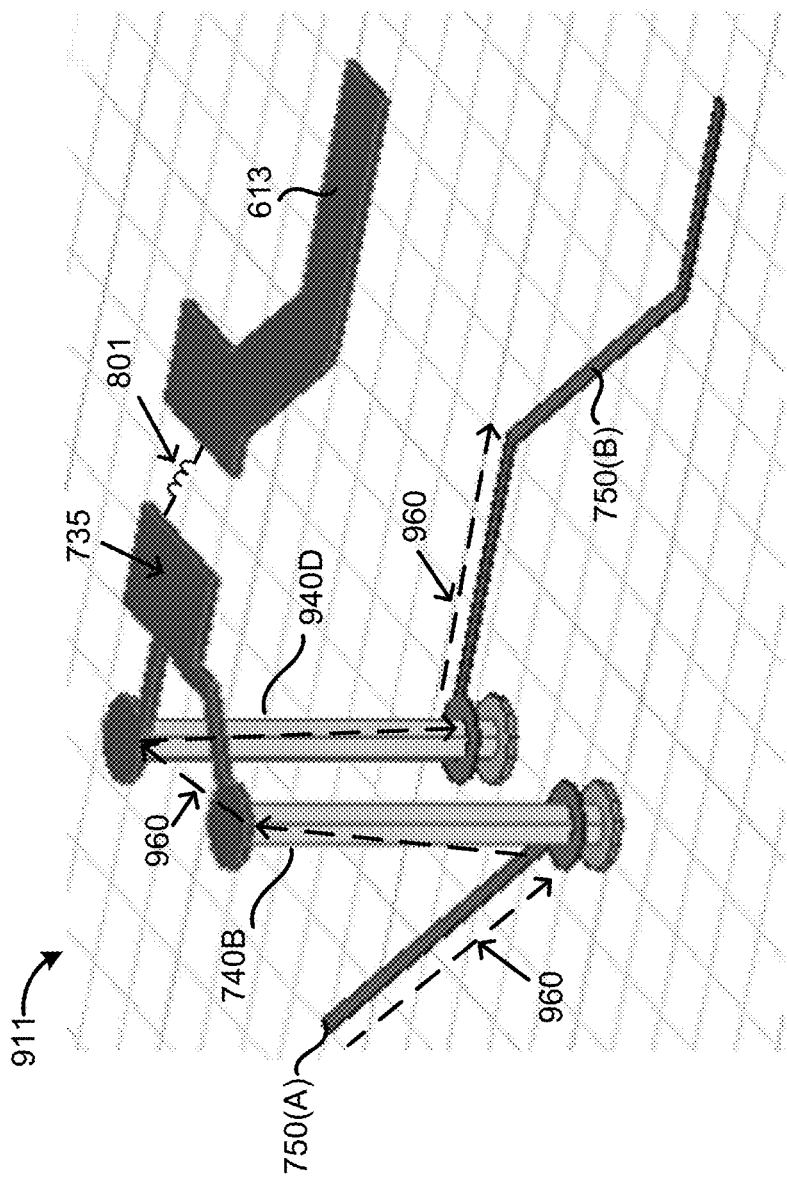
FIG. 10 is a block diagram illustrating a portion of a conductive path of FIG. 9 according to one embodiment.

To mitigate the stub effect of via 740B at POC IC 613, the routing of the conductive path 760 may be altered to include an additional via as shown in FIGS. 9-10. PCB 911 of FIGS. 9-10 can represent PCB 611 of FIGS. 7-8. A description of some elements of FIGS. 9-10 that have been described previously will be omitted for brevity.

Referring to FIG. 9, PCB 911 includes conductive path 960. Conductive path 960 can be routed through vias 740A-740C, and via 940D. For example, conductive path 960 can be routed from sensor interface 504 at surface 770 of PCB 611 to location 901 by way of via 740A. Conductive path 960 can then be routed from location 901 on layer 710A to location 903 on layer 710A (e.g., by way of a conductive trace/wire segment 750A on layer 710A). Conductive path 960 can then be routed from location 903 on layer 710A to POC IC 613 at surface 770 of PCB 611 by way of via 740B. Conductive path 960 can then be routed from POC IC 613 at surface 770 of PCB 611 to location 905 on layer 710A by way of via 940D. Conductive path 960 can be routed from location 905 on layer 710A to location 907 on layer 710A by way of conductive trace/wire segment 750B on layer 710A. Finally, conductive path 960 can be routed from location 907 on layer 710A to receiver IC 615 at surface 770 of PCB 611 by way of via 740C. Here, surface 770 of PCB 611 can be a surface that is opposite of surface 771, where electronic component 730 can be mounted on surface 770.

Utilizing the additional via 940D to route conductive path 960 from POC IC 613 to segment 750B at layer 710A results in a different configuration as conductive path 760 of FIG. 7. Here, since an incident signal from sensor interface 504 sees a continuous path 960, without a long stub (e.g., impedance discontinuity) where signal can be reflected, a signal reflection or resonance is mitigated for the incident signal, thus, minimizing signal deterioration, eliminating artifacts, and improving signal quality.

Figure 11:
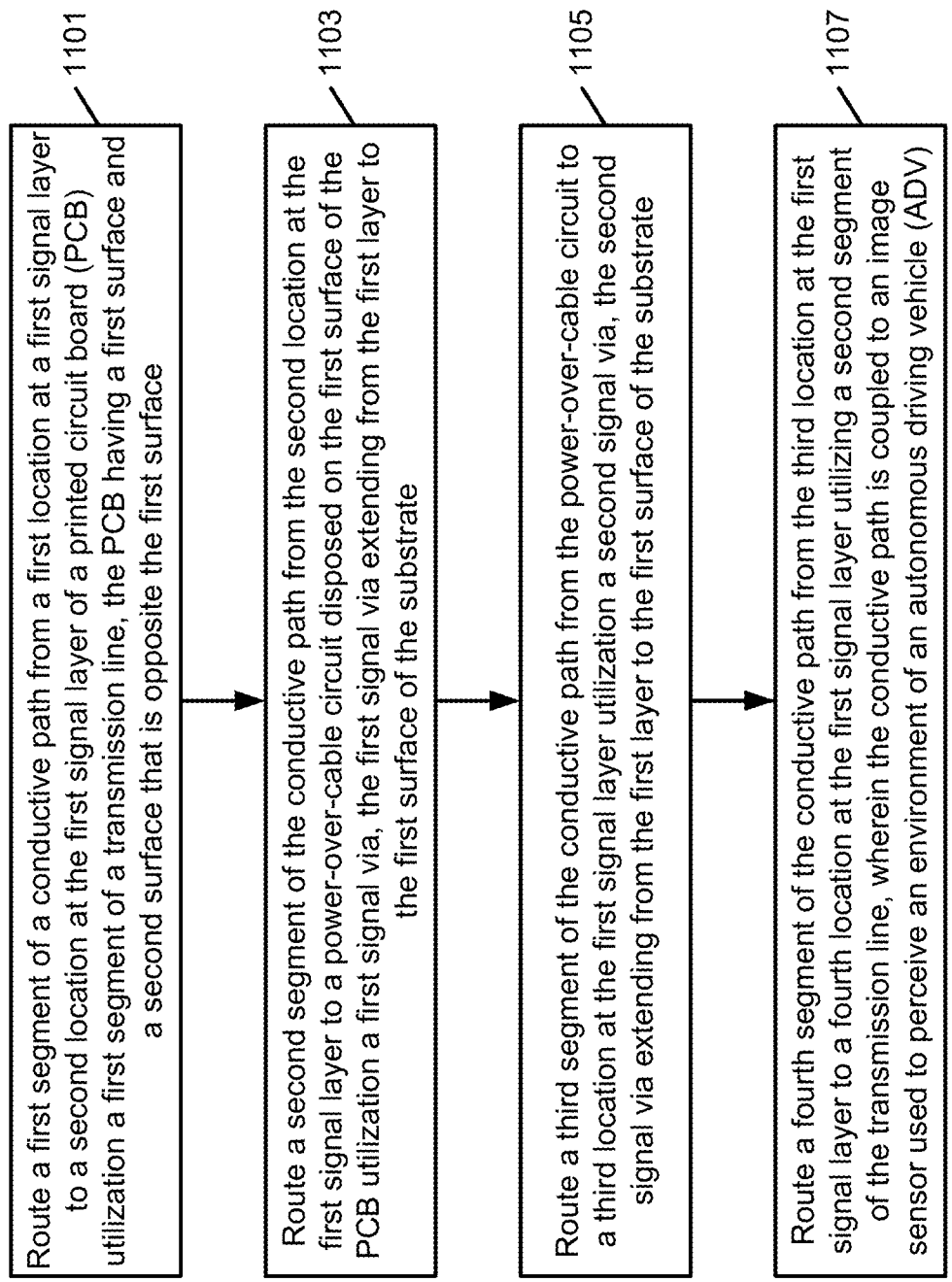
FIG. 11 is a block diagram illustrating a process to route a conductive path according to one embodiment.

FIG. 11 is a block diagram illustrating a process 1100 to route a conductive path according to one embodiment. Process 1100 may be performed by processing logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, process 1100 may be performed by a computing device (not shown) where an operator prepares a schematic for PCB 911 of FIG. 9.

With reference to FIG. 11, process 1100 illustrates example functions used by various embodiments. Although specific function blocks ("blocks") are disclosed in process 1100, such blocks are examples. That is, embodiments are well suited to performing various other blocks or variations of the blocks recited in process 1100. It is appreciated that the blocks in process 1100 may be performed in an order different than presented, and that not all of the blocks in process 1100 may be performed.

At block 1101, processing logic routes a first segment of a conductive path (e.g., path 960 of FIG. 9) from a first location (e.g., location 901) at a first signal layer (layer 710A) to a second location (e.g., location 903) at the first signal layer (layer 710A) of a printed circuit board (PCB)

(PCB 911) utilizing a first segment of a transmission line (segment 750A), the PCB having a first surface (surface 770) and a second surface (surface 771) that is opposite the first surface.

At block 1103, processing logic routes a second segment of the conductive path from the second location (e.g., location 903 of FIG. 9) at the first signal layer (layer 710A) to a power-over-cable circuit (e.g., POC IC 613) disposed on the first surface of the PCB (surface 770) utilizing a first signal via (via 740B), the first signal via extending from the first layer (layer 710A) to the first surface of the substrate (surface 770).

At block 1105, processing logic routes a third segment of the conductive path from the power-over-cable circuit (e.g., POC IC 613) to a third location (e.g., location 905) at the first signal layer (710A) utilizing a second signal via (via 940D), the second signal via extending from the first layer to the first surface of the substrate.

At block 1107, processing logic routes a fourth segment of the conductive path from the third location (e.g., location 905 of FIG. 9) at the first signal layer to a fourth location (e.g., location 907) at the first signal layer utilizing a second segment (segment 750B) of the transmission line (segments 750A, 750B), wherein the conductive path is coupled to an image sensor used to perceive an environment of an autonomous driving vehicle (ADV).

In one embodiment, processing logic further routes a fifth segment of the conductive path from the first location (e.g., location 901) to a connector interface (interface 504) utilizing a third signal via (via 740A), the third signal via extending from the first layer to the first surface of the substrate.

In one embodiment, the connector interface (interface 504) is coupled to a transmission cable (cable 621 of FIG. 6) to receive a signal from the image sensor. The signal can be high frequency with a transmission rate of greater than 1 gigabit per second.

In one embodiment, the transmission cable is a single wire carrying a serialized signal of the image sensor (e.g., such as sensor 510A of FIG. 6) and carrying power from a power-over-cable circuit (POC IC 613 of FIG. 6) to the image sensor.

In one embodiment, processing logic further routes a sixth segment of the conductive path from the fourth location (e.g., location 907 of FIG. 9) at the first signal layer to a receiver chipset (receiver IC 615) utilizing a fourth signal via (via 740C), the fourth signal via extending from the first layer to the first surface of the substrate and the receiver chipset receives a signal for processing.

In one embodiment, the transmission line is a microstrip. In one embodiment, a power transmitted from the power-over-cable circuit to the image sensor is direct current (DC) wherein the signal transmitted from the image sensor to the receiver chipset is a signal with a frequency greater than a gigabits per second.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A method for routing a conductive path within a printed circuit board (PCB), comprising:

routing a first segment of a conductive path from a first location at a first signal layer to a second location at the first signal layer of a printed circuit board (PCB) utilizing a first segment of a transmission line, the PCB having a first surface and a second surface that is opposite the first surface;

routing a second segment of the conductive path from the second location at the first signal layer to a power-over-cable circuit disposed on the first surface of the PCB utilizing a first signal via, the first signal via extending from the first layer to the first surface of a substrate;

routing a third segment of the conductive path from the power-over-cable circuit to a third location at the first signal layer utilizing a second signal via, the second signal via extending from the first layer to the first surface of the substrate; and routing a fourth segment of the conductive path from the third location at the first signal layer to a fourth location at the first signal layer utilizing a second segment of the transmission line, wherein the conductive path is coupled to an image sensor used to perceive an environment of an autonomous driving vehicle (ADV).

2. The method of claim 1, further comprising routing a fifth segment of the conductive path from the first location to a connector interface utilizing a third signal via, the third signal via extending from the first layer to the first surface of the substrate.

3. The method of claim 2, wherein the connector interface is coupled to a transmission cable to receive a signal from the image sensor.

4. The method of claim 3, wherein the transmission cable is a single wire carrying a serialized signal of the image sensor and carrying power from a power-over-cable circuit to the image sensor.

5. The method of claim 3, further comprising routing a sixth segment of the conductive path from the fourth location at the first signal layer to a receiver chipset utilizing a fourth signal via, the fourth signal via extending from the first layer to the first surface of the substrate and the receiver chipset receives a signal for processing.

6. The method of claim 1, wherein the transmission line is a microstrip.

7. The method of claim 1, wherein a power is transmitted from the power-over-cable circuit to the image sensor is direct current (DC) and a signal is transmitted from the image sensor to a receiver chipset is a signal with a frequency greater than a gigabits per second.

8. A printed circuit board (PCB) of an autonomous driving vehicle, comprising:
a substrate;
one or more signal layers in between a first surface and a second surface of the substrate, the one or more signal layers including a first signal layer;
a first segment of a transmission line disposed at the first signal layer electrically coupling a first location to a second location of the first signal layer;
a first signal via disposed at the second location extending from the first layer to the first surface of the substrate;
a second segment of the transmission line disposed at the first signal layer electrically coupling a third location to a fourth location of the first signal layer;
a second signal via disposed at the third location of the first signal layer extending from the first layer to the first surface of the substrate; and
a power-over-cable circuit disposed on the first surface of the substrate and electrically coupled to the first and second signal via, wherein the first and second segments of the transmission line carry a signal of an image sensor from the first location to the fourth location and the first segment of the transmission line carries power from the power-over-cable circuit to the image sensor, wherein the image sensor is used to perceive an environment of an autonomous driving vehicle (ADV).

9. The PCB of claim 8, further comprising a third signal via disposed at the first location extending from the first layer to the first surface of the substrate, the third signal via electrically coupling a connector interface to the first segment of the transmission line at the first location.

10. The PCB of claim 8, further comprising a connector interface disposed on the first surface and electrically coupled to a third signal via, wherein a transmission cable that is electrically coupled to the image sensor is extended to electrically couple the image sensor to the connector interface.

11. The PCB of claim 10, wherein the transmission cable is a single wire carrying a serialized signal of the image sensor and carrying power from the power-over-cable circuit of the PCB to the image sensor.

12. The PCB of claim 8, further comprising a fourth signal via disposed at the fourth location extending from the first layer to the first surface of the substrate and the fourth signal via is electrically coupled to a receiver chipset to transmit the signal of the image sensor to the receiver chipset.

13. The PCB of claim 8, wherein the transmission line is a microstrip.

14. The PCB of claim 8, wherein the power transmitted from the power-over-cable circuit to the image sensor is direct current (DC) wherein the signal transmitted from the image sensor to a receiver chipset is a signal with a frequency greater than a gigabits per second.

15. A sensor system of an autonomous driving vehicle, comprising:
an image sensor;
a printed circuit board (PCB); and
a transmission cable electrically coupling the image sensor to the PCB, wherein the PCB comprises:
a substrate;
one or more signal layers in between a first surface and a second surface of the substrate including at least a first signal layer;
a first segment of a transmission line disposed at the first signal layer electrically coupling a first location and a second location of the first signal layer;
a first signal via disposed at the second location extending from the first layer to the first surface of the substrate;
a second segment of the transmission line disposed at the first signal layer electrically coupling a third location and a fourth location of the first signal layer;
a second signal via disposed at the third location of the first signal layer extending from the first layer to the first surface of the substrate; and
a power-over-cable circuit disposed on the first surface of the substrate and electrically coupled to the first and second signal via, wherein the first and second segments of the transmission line carry a signal of the image sensor from the first location to the fourth location and the first segment of the transmission line carries power from the power-over-cable circuit to the image sensor, wherein the image sensor is used to perceive an environment of an autonomous driving vehicle (ADV).

16. The sensor system of claim 15, further comprising a third signal via disposed at the first location extending from the first layer to the first surface of the substrate, the third signal via electrically coupling a connector interface to the first segment of the transmission line at the first location.

17. The sensor system of claim 15, further comprising a connector interface disposed on the first surface and electrically coupled to a third signal via, wherein a transmission cable that is electrically coupled to the image sensor is extended to electrically couple the image sensor to the connector interface.

18. The sensor system of claim 17, wherein the transmission cable is a single wire carrying a serialized signal of the image sensor and carrying power from a power-over-cable circuit of the PCB to the image sensor.

19. The sensor system of claim 15, further comprising a fourth signal via disposed at the fourth location extending from the first layer to the first surface of the substrate and the fourth signal via is electrically coupled to a receiver chipset to transmit the signal of the image sensor to the receiver chipset.

20. The sensor system of claim 15, wherein the power transmitted from the power-over-cable circuit to the image sensor is direct current (DC) wherein the signal transmitted from the image sensor to a receiver chipset is a signal with a frequency greater than a gigabits per second.

* * * * *